United States Patent [19]
Rybicki

[11] Patent Number: 5,635,936
[45] Date of Patent: Jun. 3, 1997

[54] METHOD AND APPARATUS FOR PROVIDING A HIGH CURRENT DRIVER ON INTEGRATED CIRCUITS

[75] Inventor: Mathew A. Rybicki, Austin, Tex.

[73] Assignee: Motorola Inc., Schaumburg, Ill.

[21] Appl. No.: 316,681

[22] Filed: Sep. 30, 1994

[51] Int. Cl.$^6$ ................................................ H03M 1/66
[52] U.S. Cl. .................................................. 341/144
[58] Field of Search ........................... 341/144, 141, 341/101, 145; 375/286, 298, 300

[56] References Cited

U.S. PATENT DOCUMENTS

| | | | |
|---|---|---|---|
| 5,243,346 | 9/1993 | Inami | 341/144 |
| 5,459,749 | 10/1995 | Park | 375/286 |

*Primary Examiner*—Brian K. Young

[57] ABSTRACT

An integrated circuit (100) may provide a high current, wide band, high fidelity output by providing a digital signal source (101) coupled to a first digital to analog source (102) and a second digital to analog source (103). The first digital to analog source (102) has a first power factor and a first fidelity factor, while the second digital to analog source (103) has a second power factor and a second fidelity factor, wherein the first power factor is greater than the second power factor. The outputs of the first and second digital to analog sources (107 and 108) are combined to provide a resultant (109), wherein the resultant (109) has a third power factor which is in the range of the first power factor and has a third fidelity factor which is greater than either the first fidelity factor the second fidelity factor.

18 Claims, 1 Drawing Sheet

METHOD AND APPARATUS FOR PROVIDING A HIGH CURRENT DRIVER ON INTEGRATED CIRCUITS

FIELD OF THE INVENTION

This invention relates generally to integrated circuits and in particular to a method and apparatus for providing a high current source line driver on integrated circuits.

BACKGROUND OF THE INVENTION

Integrated circuits are known to provide a plurality of outputs which am coupled to a multitude of circuits. Some of these circuits have high input impedance, such that the integrated circuit needs to supply a relatively low amount of current, (100 µA). Other circuits have a relatively low input impedance such that the integrated circuit has to supply a substantial amount of current, (10–100 mA).

In many applications, an integrated circuit is capable of providing the necessary current. In other applications, when the output of an integrated circuit is driving a relatively low impedance, an external output buffer is generally used to provide the necessary current. Such external output buffers have a relatively high impedance and provide a substantial amount of current to the particular device being sourced by the integrated circuit.

Integrated circuits that perform telecommunication functions are also well known in the art. Such integrated circuits perform functions such as audio processing, audio compression, etc. In utilizing such integrated circuits, the output requirements for the driving integrated circuit are usually below 100 mA peak. As the need for higher data rate transmissions along twisted telephone wire pairs arises, present integrated circuits are incapable of driving the relatively low impedance of the telephone twisted wire pairs. For example, at a 1 megahertz (MHz) rate, the impedance of a twisted telephone wire pair is roughly 100 ohms. Typical voltage range on these types of high frequency data transfers is a swing of +or −5 volts. Thus, the amount of current needed is 100 mA average. An additional requirement of high data rate transmissions is that the fidelity, or total harmonic distortion, must be extremely high. For example, the total harmonic distortion must be in excess of 70 decibels (dB). Current integrated circuits, while able to supply 100 mA, cannot meet the fidelity requirements. Other circuits, while capable of meeting the fidelity requirements, cannot source the current.

One typical prior art technique to overcome this is to eliminate the use of integrated circuits and utilize discrete components. It is well known that discrete line drivers can supply the necessary currents and fidelity requirements, however, for portable communication devices, discrete components increase the size of the device. A second typical prior art technique would be to use integrated circuits having high fidelity and low current, and couple the output to a discrete high fidelity line driver. While both of these solutions provide the desired results, they require additional board space, components, and cost. Therefore, a need exists for integrated circuits that provide high current high fidelity output signals over a wide bandwidth without the need for external circuits.

DETAILED DESCRIPTION OF THE DRAWINGS

Generally, the present invention provides a method and apparatus for an integrated circuit to provide a high current, high fidelity output. This is accomplished by providing a digital signal source coupled to a first digital to analog source and a second digital to analog source. The first digital to analog source has a first power factor and a first fidelity factor, while the second digital to analog source has a second power factor and a second fidelity factor, wherein the first power factor is greater than the second power factor. The outputs of the first and second digital to analog sources are combined to provide an output, wherein the output has a third power factor which is in the range of the first power factor and has a third fidelity factor which is greater than either the first fidelity factor or the second fidelity factor. With such a method and apparatus, the present invention provides a solution that allows an integrated circuit to provide a high current, wide band, high fidelity output without the need for external current drivers.

Figure 1:
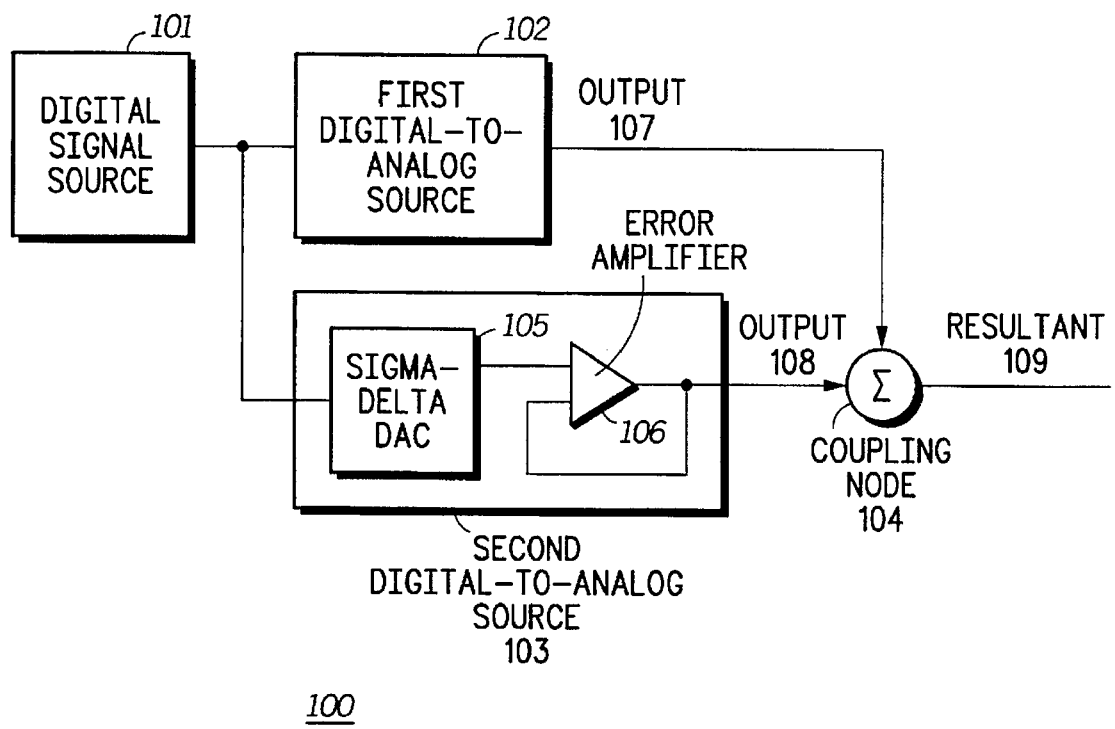
FIG. 1 illustrates a schematic diagram of a high fidelity high current wide band driver in accordance with the present invention.

FIG. 1 illustrates a high current, wide band, high fidelity current source driver for use on integrated circuits 100. As shown, the circuit 100 includes a digital signal source 101, a first digital to analog source 102, a second to digital to analog source 103, and a coupling node 104. The digital signal source 101 may be any source that generates digital signals. For example, the digital signal source may be a data converter for use in high data rate transmissions on telephone lines, a digital audio processor, a data generator that provides multimedia information, or the digital storage medium such as RAM, ROM, CD-ROM, etc.

The first digital to analog source 102 is a digital to analog converter (DAC) that has a relatively high current source output with a moderate fidelity rate. For example, if the first DAC 102 is a current DAC (IDAC) it can typically source 100 mA, however, its fidelity factor is approximately 40 dB. This type of device is readily available for use on an integrated circuit. The second DAC 103 includes a sigma delta DAC 105 coupled to an error amplifier 106. The sigma delta DAC 105 needs, for linearity, a fidelity factor in excess of 70 dB, while the error amplifier 106 has a fidelity factor, or total harmonic distortion, of 60 dB. It is important that the sigma delta DAC 105 have a fidelity factor greater than the desired fidelity factor of the resultant 109. By combining the outputs 107 and 108 of the first and second DACs 102 and 103 at the coupling node 104, the resultant 109 has a fidelity factor greater than the fidelity factors of either the first DAC 102 or the second DAC 103, where the fidelity factor of the second DAC 103 is limited by the fidelity factor of the error amplifier 106. The coupling node 104, may be any means for combining two analog signals, such as an adder, current summer, etc.

As an illustrated example of the circuit shown in FIG. 1, assume that the first DAC 102 has a fidelity factor of 40 dB while the sigma delta DAC 105 has a fidelity factor of 70 dB and the error amplifier 106 has a fidelity factor of 60 dB. By combining the outputs of the first and second DACs 107 and 108, the fidelity factor of the resultant 109 is 70 dB. With such a high fidelity factor, and the ability to source high current, the present invention provides a practical solution for driving the low impedance loads of twisted telephone wire at frequencies up to and in excess of 1 MHz.

Continuing with the illustrated example, the first DAC 102 provides the majority of the current being supplied, while the second DAC 103 provides error correction. By coupling the error amplifier 106 as shown, the error amplifier 106 compensates its output current to provide the error correction such that the resultant 109 is at the desired current and fidelity levels.

Figure 2:
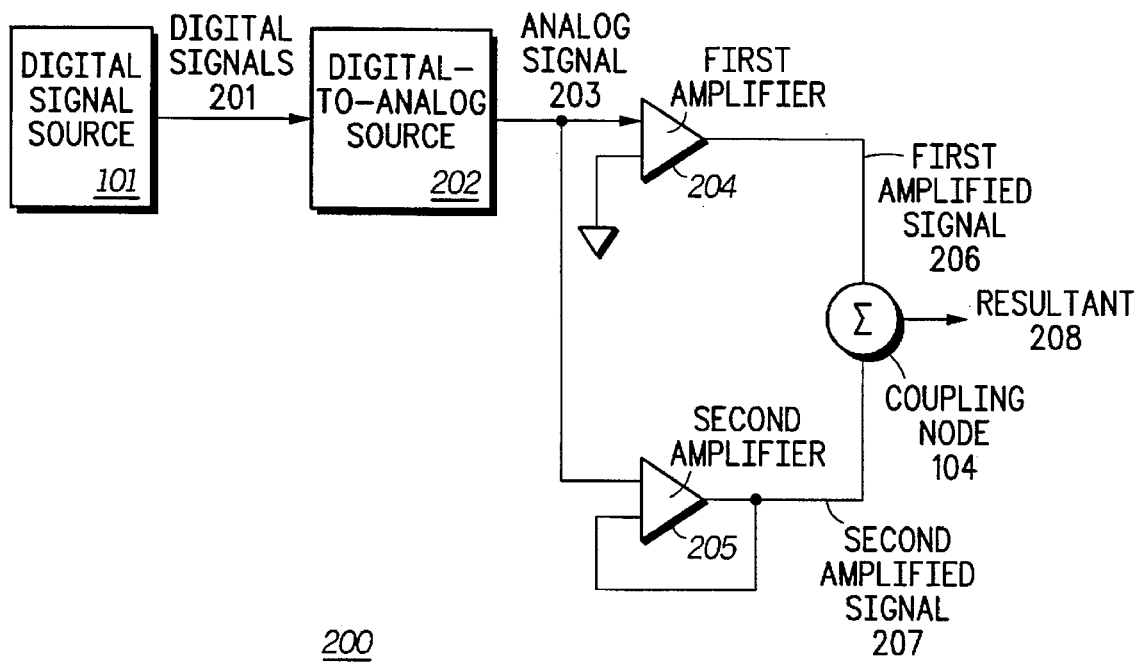
FIG. 2 illustrates an alternative embodiment of a high fidelity high current wide band driver in accordance with the present invention.

FIG. 2 illustrates an alternative embodiment of a high current, wide band, high fidelity current source driver for use on integrated circuits 200. The circuit 200 includes the digital source 101, a digital to analog source 202, a first amplifier 204, a second amplifier 205, and the coupling node 104. The digital source 101, as mentioned above, provides digital signals 201. These digital signals 201 are then converted to an analog signal 203 via the digital to analog source 202. The digital to analog source 202, may be a high fidelity sigma delta DAC.

The analog signal 203 is sourced in parallel to the first amplifier 204 and the second amplifier 205. The first amplifier, which may be an operational transconductance amplifier (OTA), or voltage to current amplifier, converts the analog signal 203 into a first amplified signal 206. The second amplifier 205, which may be a voltage amplifier, converts the analog signal 203 into a second amplified signal 207. The coupling node 104 combines the first amplified signal 206 with the second amplified signal 207 to produce a resultant 208. As with the circuit shown in FIG. 1, this particular circuit provides a similar high fidelity, high current, wide band output.

As an illustrated example of the circuit in FIG. 2, assume that the DAC 202 has a fidelity factor of 70 dB while the first amplifier 204 has a fidelity factor of 40 dB and the second amplifier 205 has a fidelity factor of 60 dB. The first amplifier 204 provides a majority of the current sourced, while the second amplifier provides an error current such that the output current is at the desired magnitude and fidelity factors. By utilizing the second amplifier 205 to provide the error factor, the resultant output 208 has a 70 dB fidelity factor, which is approximately equal to the fidelity factor of the digital to analog source 202.

The present invention provides a method and apparatus for creating a high current, wide band, high fidelity current source driver for implementation on an integrated circuit. With such a method and apparatus, the prior art requirements for external line drivers are eliminated. Thus, the present invention provides an integrated circuit that reduces circuit complexity and cost.

I claim:

1. An integrated circuit comprising:
a digital signal source;
a first digital to analog source operably coupled to the digital signal source, wherein the first digital to analog source has a first power factor and a first fidelity factor;
a second digital to analog source operably coupled to the digital signal source, wherein the second digital to analog source has a second power factor and a second fidelity factor, wherein the first power factor is greater than the second power factor; and
a coupling node operably coupled to the first digital to analog source and the second digital to analog source, wherein the coupling node combines an output of the first digital to analog source with an output of the second digital to analog source to produce a resultant having a third power factor and a third fidelity factor, wherein the third power factor is within a range of the first power factor and the third fidelity factor is greater than either the first fidelity factor or the second fidelity factor.

2. The integrated circuit of claim 1, wherein the second fidelity factor is greater than the first fidelity factor.

3. The integrated circuit of claim 1, wherein the first digital to analog source is a current digital to analog converter.

4. The integrated circuit of claim 1, wherein the second digital to analog source is a digital to analog converter, wherein the digital to analog converter has a fourth fidelity factor which is greater than the third fidelity factor serially coupled to an error amplifier.

5. The integrated circuit of claim 1, wherein the coupling node is an adder.

6. An integrated circuit comprising:
an analog signal source that provides an analog signal;
a first amplifier operably coupled to the analog signal source, wherein the first amplifier amplifies the analog signal to produce a first amplified signal having a first power factor and a first fidelity factor;
a second amplifier operably coupled to the analog signal source, wherein the second amplifier amplifies the analog signal to produce a second amplified signal having a second power factor and a second fidelity factor, and wherein the first power factor is greater than the second power factor; and
a coupling node operably coupled to the first amplifier and the second amplifier, wherein the coupling node combines the first amplified signal with the second amplified signal to produce a resultant having a third power factor and a third fidelity factor, wherein the third power factor is within a range of the first power factor and the third fidelity factor is greater than either the first fidelity factor or the second fidelity factor.

7. The integrated circuit of claim 6, wherein the second fidelity factor is greater than the first fidelity factor.

8. The integrated circuit of claim 6, wherein coupling node is an adder.

9. The integrated circuit of claim 6, wherein the first amplifier is a operational transconductance amplifier.

10. The integrated circuit of claim 9, wherein the second amplifier is a voltage amplifier.

11. An integrated circuit comprising:
a digital signal source that provides digital signals;
a digital to analog source operably coupled to the digital signal source, wherein the digital to analog source converts the digital signals to an analog signal;
a first amplifier operably coupled to the digital to analog source, wherein the first amplifier amplifies the analog signal to produce a first amplified signal having a first power factor and a first fidelity factor;
a second amplifier operably coupled to the digital to analog source, wherein the second amplifier amplifies the analog signal to produce a second amplified signal having a second power factor and a second fidelity factor, and wherein the first power factor is greater than the second power factor; and
a coupling node operably coupled to the first amplifier and the second amplifier, wherein the coupling node combines the first amplified signal with the second amplified signal to produce a resultant having a third power factor and a third fidelity factor, wherein the third power factor is within a range of the first power factor and the third fidelity factor is greater than either the first fidelity factor or the second fidelity factor.

12. The integrated circuit of claim 11, wherein the second fidelity factor is greater than the first fidelity factor.

13. The integrated circuit of claim 11, wherein the coupling node is an adder.

14. The integrated circuit of claim 11, wherein the first amplifier is an operational transconductance amplifier.

15. The integrated circuit of claim 11, wherein the second amplifier is a voltage amplifier.

16. The integrated circuit of claim 11, wherein the digital to analog source is a sigma delta digital to analog converter.

17. A method for providing a high powered output on an integrated circuit, the method comprising the steps of:
   a) converting a digital signal to a first analog signal, wherein the first analog signal has a first power factor and a first fidelity factor;
   b) converting the digital signal to a second analog signal, wherein the second analog signal has a second power factor and a second fidelity factor, wherein the first power factor is greater than the second power factor; and
   c) combining the first analog signal with the second analog signal to produce a third analog signal having a third power factor and a third fidelity factor, wherein the third power factor is within a range of the first power factor and the third fidelity factor is greater than either the first fidelity factor or the second fidelity factor.

18. A method for providing a high powered output on an integrated circuit, the method comprising the steps of:
   a) converting a digital signal into an analog signal;
   b) amplifying the analog signal to produce a first amplified signal having a first power factor and a first fidelity factor;
   c) amplifying the analog signal to produce a second amplified signal having a second power factor and a second fidelity factor, and wherein the first power factor is greater than the second power factor; and
   d) combining the first amplified signal with the second amplified signal to produce a third amplified signal having a third power factor and a third fidelity factor, wherein the third power factor is within a range of the first power factor and the third fidelity factor is greater than either the first fidelity factor or the second fidelity factor.

* * * * *